(12) United States Patent
Jayanti et al.

(10) Patent No.: US 10,103,160 B2
(45) Date of Patent: Oct. 16, 2018

(54) SEMICONDUCTOR STRUCTURES INCLUDING DIELECTRIC MATERIALS HAVING DIFFERING REMOVAL RATES

(71) Applicant: Micron Technology, Inc., Boise, ID (US)

(72) Inventors: Srikant Jayanti, Boise, ID (US); Fatma Arzum Simsek-Ege, Boise, ID (US); Pavan Kumar Reddy Aella, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/013,298

(22) Filed: Feb. 2, 2016

(65) Prior Publication Data

US 2016/0148949 A1    May 26, 2016

Related U.S. Application Data

(62) Division of application No. 13/964,282, filed on Aug. 12, 2013, now Pat. No. 9,275,909.

(51) Int. Cl.
*H01L 27/115* (2017.01)
*H01L 29/788* (2006.01)
(Continued)

(52) U.S. Cl.
CPC ...... *H01L 27/11582* (2013.01); *H01L 21/022* (2013.01); *H01L 21/0234* (2013.01); *H01L 21/02164* (2013.01); *H01L 21/02274* (2013.01); *H01L 21/28273* (2013.01); *H01L 21/28282* (2013.01); *H01L 21/31111* (2013.01);
(Continued)

(58) Field of Classification Search
None
See application file for complete search history.

(56) References Cited

U.S. PATENT DOCUMENTS 6,191,050 B1    2/2001  Andideh
6,426,285 B1    7/2002  Chen et al.
(Continued)

FOREIGN PATENT DOCUMENTS

CN    101483194 A    7/2009
CN    103066076 A    4/2013
(Continued)

OTHER PUBLICATIONS

International Search Report of the ISA/KR, Application No. PCT/US2014/047967, dated Nov. 10, 2014, 3 pages.
(Continued)

*Primary Examiner* — Daniel Whalen
(74) *Attorney, Agent, or Firm* — TraskBritt (57) ABSTRACT

Semiconductor structures may include a stack of alternating dielectric materials and control gates, charge storage structures laterally adjacent to the control gates, a charge block material between each of the charge storage structures and the laterally adjacent control gates, and a pillar extending through the stack of alternating oxide materials and control gates. Each of the dielectric materials in the stack has at least two portions of different densities and/or different rates of removal. Also disclosed are methods of fabricating such semiconductor structures.

20 Claims, 10 Drawing Sheets

(51) Int. Cl.
*H01L 27/11582* (2017.01)
*H01L 21/28* (2006.01)
*H01L 21/8239* (2006.01)
*H01L 21/311* (2006.01)
*H01L 27/11556* (2017.01)
*H01L 29/66* (2006.01)
*H01L 29/04* (2006.01)
*H01L 29/16* (2006.01)
*H01L 29/51* (2006.01)
*H01L 21/02* (2006.01)
*H01L 21/3213* (2006.01)
*H01L 29/792* (2006.01)
*H01L 27/11551* (2017.01)

(52) U.S. Cl.
CPC .... *H01L 21/32134* (2013.01); *H01L 21/8239* (2013.01); *H01L 27/11556* (2013.01); *H01L 29/04* (2013.01); *H01L 29/16* (2013.01); *H01L 29/511* (2013.01); *H01L 29/518* (2013.01); *H01L 29/66825* (2013.01); *H01L 29/7883* (2013.01); *H01L 29/7889* (2013.01); *H01L 27/11551* (2013.01); *H01L 29/7926* (2013.01)

(56) References Cited

U.S. PATENT DOCUMENTS

| | | | |
|---|---|---|---|
| 2002/0142547 A1* | 10/2002 | Chang | H01L 21/76804 438/257 |
| 2008/0315285 A1 | 12/2008 | Lee et al. | |
| 2009/0283911 A1 | 11/2009 | Tsai et al. | |
| 2009/0294828 A1 | 12/2009 | Ozawa et al. | |
| 2010/0059811 A1* | 3/2010 | Sekine | H01L 21/28282 257/324 |
| 2010/0148241 A1 | 6/2010 | Akiyama et al. | |
| 2011/0018052 A1* | 1/2011 | Fujiwara | H01L 27/11526 257/324 |
| 2011/0171835 A1 | 7/2011 | Kabe et al. | |
| 2011/0294290 A1* | 12/2011 | Nakanishi | H01L 27/11551 438/666 |
| 2011/0304053 A1 | 12/2011 | Lin et al. | |
| 2012/0132981 A1* | 5/2012 | Imamura | H01L 27/11556 257/321 |
| 2012/0217564 A1 | 8/2012 | Tang et al. | |
| 2012/0220088 A1 | 8/2012 | Alsmeier | |
| 2012/0273863 A1 | 11/2012 | Ozawa et al. | |
| 2013/0049095 A1 | 2/2013 | Whang et al. | |
| 2013/0119452 A1 | 5/2013 | Endoh et al. | |
| 2013/0270625 A1 | 10/2013 | Jang et al. | |
| 2014/0203344 A1 | 7/2014 | Hopkins et al. | |
| 2014/0264532 A1 | 9/2014 | Dennison et al. | |
| 2015/0041879 A1 | 2/2015 | Jayanti et al. | |

FOREIGN PATENT DOCUMENTS

| | | |
|---|---|---|
| JP | 2008258653 A | 10/2008 |
| JP | 2009004751 A | 1/2009 |
| JP | 2009295617 A | 12/2009 |
| JP | 2010087185 A | 4/2010 |
| JP | 2010141256 A | 6/2010 |
| JP | 2010157734 A | 7/2010 |

OTHER PUBLICATIONS

International Written Opinion for International Application No. PCT/US2014/047967, dated Nov. 10, 2014, 4 pages.
European Search Report for European Application No. 14835785.8, dated Feb. 17, 2017, 7 pages.
Japanese Office Action for Japanese Application No. 2016-533315, dated Mar. 29, 2017, 29 pages.
Notice of Reasons for Rejection for Korean Application No. 10-2016-7004727, dated Jun. 16, 2017, 9 pages.
Korean Written Opinion for Korean Application No. 10-2016-7004727, dated Aug. 4, 2017, 8 pages.
Chinese Office Action from Chinese Application No. 201480044617.1, dated Jan. 2, 2018, 10 pages include English translation.
European Examination Report for European Application No. 14835785.8, dated Nov. 10, 2017, 6 pages.

* cited by examiner

SEMICONDUCTOR STRUCTURES INCLUDING DIELECTRIC MATERIALS HAVING DIFFERING REMOVAL RATES

CROSS-REFERENCE TO RELATED APPLICATION

This application is a divisional of U.S. patent application Ser. No. 13/964,282 filed Aug. 12, 2013,now U.S. Pat. No. 9,275,909, issued Mar. 1, 2016, the disclosure of which is hereby incorporated herein in its entirety by this reference.

FIELD

The present disclosure, in various embodiments, relates generally to semiconductor device design and fabrication. More particularly, the present disclosure relates to design and fabrication of memory devices having three-dimensionally arranged memory cells.

BACKGROUND

Semiconductor memory devices may be classified into volatile memory devices and nonvolatile memory devices. In contrast to volatile memory devices, nonvolatile memory devices, such as flash memory devices, retain stored data even when power is removed. Therefore, nonvolatile memory devices, such as flash memory devices, are widely used in memory cards and in electronic devices. Due to rapidly growing digital information technology, there are demands to continuingly increase the memory density of the flash memory devices while maintaining, if not reducing, the size of the devices.

Three-dimensional (3D)-NAND flash memory devices have been investigated for increasing the memory density. The 3D-NAND architecture includes a stack of memory cells having a plurality of charge storage structures (e.g., floating gates, charge traps or the like), a stack of alternating control gates and dielectric materials, and charge blocking materials disposed between the charge storage structures (mostly referred to by example as floating gates hereinafter) and the adjacent control gates. An oxide material, such as silicon oxide, is conventionally used as the dielectric material. The charge blocking material may be an inter-poly dielectric (IPD) material, such as oxide-nitride-oxide (ONO) material.

Figure 1:
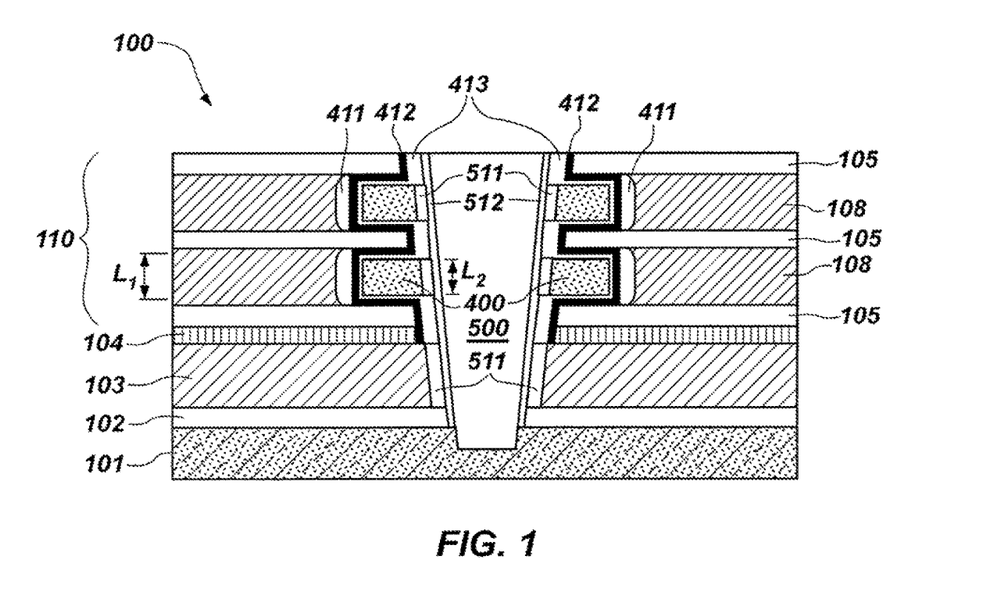
FIG. 1 shows a semiconductor structure suitable for processing of a 3D-NAND flash memory device.

FIG. 1 shows a semiconductor structure 100 that may be further processed to form a 3D-NAND flash memory device. The semiconductor structure 100 includes a stack 110 of alternating control gates 108 and dielectric materials 105 over a material 103 to be used as control gate of a select device, such as a select gate source (SGS) or a select gate drain (SGD), a plurality of floating gates 400, a charge blocking material (411, 412, 413) positioned between the floating gates 400 and adjacent control gates 108, and a channel material 500 extending through the stack 110, the control gate material 103, a dielectric material 102, and a portion of a source 101. The source 101 could be formed in and/or on a substrate (not shown), such as a semiconductor substrate comprising monocrystalline silicon. Optionally, the semiconductor structure 100 may include an etch stop material 104. Although not depicted here, in other embodiments, the depicted material 101 may form or be part of a bit line (e.g., instead of a source). The control gates 108 each has a height of $L_1$. The floating gates 400 each has a height of $L_2$. Due to the presence of the charge blocking material (411, 412, 413) around the discrete floating gate 400, the height $L_2$ of each discrete floating gate 400 is approximately half the height $L_1$ of an adjacent control gate. For example, the height of the floating gate in the direction of current flow (e.g., in a pillar of a string of the memory cells) may be approximately 15 nm compared to the height of an adjacent control gate, which is approximately 30 nm. In addition, the floating gate is not aligned with the adjacent control gate.

During use and operation, a charge may get trapped on portions of the IPD material, such as on portions of the IPD material that are horizontally disposed between a floating gate and adjacent dielectric material. When the IPD material is an ONO material, the charge may get trapped in the horizontal nitride portions of the IPD material that are not between the control gates and the floating gates. Trapped charge can migrate along the IPD material, such as through program, erase or temperature cycling. The presence of the IPD material creates a direct path for programming/erasing into the nitride material of the IPD material and degrades cell program-erase cycling. Such charge trapping or movement can alter the threshold voltage ($V_t$) of the memory cells or degrade incremental step pulse programming (ISPP) relative to memory cells that do not have such charge trapping in the nitride. Charge trap jeopardizes the controllability of the channel characteristics and the reliability of the 3D-NAND flash memory device.

To minimize charge trap in the horizontal IPD portions, it is desirable to reduce the amount of the horizontal IPD portions, such as by increasing the height of a floating gate relative to the height of an adjacent control gate. In addition to reducing the undesirable charge trap, increasing the height of floating gate in the direction of current flow through the channel may offer a higher degree of channel conductance modulation (e.g., a higher on/off ratio), a reduced cell noise (e.g., a larger floating gate), and a reliability gain. The attempts to increase the height of floating gates to about the same as that of adjacent control gates require the addition of numerous deposition/dry/wet etch steps, resulting in a complex and rather costly fabrication process. Furthermore, these additional deposition/dry/wet etch steps often associate with an undesirable increase in the critical dimension.

Therefore, it would be beneficial to have a fabrication process for forming the floating gates having a height approximately the same as the height of adjacent control gates that utilizes relatively few additional acts and without jeopardizing other properties and performances of the fabricated structure.

DETAILED DESCRIPTION

The following description provides specific details, such as material types, material thicknesses, and processing conditions in order to provide a thorough description of embodiments of the disclosure. However, a person of ordinary skill in the art will understand that embodiments of the present disclosure may be practiced without employing these specific details. Indeed, the embodiments of the present disclosure may be practiced in conjunction with conventional fabrication techniques employed in the industry.

In addition, the description provided herein does not form a complete process flow for forming a semiconductor device structure, and the semiconductor device structures described below do not form a complete semiconductor device. Only those process acts and structures necessary to understand the embodiments of the present disclosure are described in detail below. Additional acts to form the complete semiconductor device may be performed by conventional fabrication techniques. Also the drawings accompanying the application are for illustrative purposes only, and are thus not necessarily drawn to scale. Elements common between figures may retain the same numerical designation. Furthermore, while the materials described and illustrated herein may be formed as layers, the materials are not limited thereto and may be formed in other three-dimensional configurations.

As used herein, any relational terms, such as "first," "second" and "third," or "top," "middle" and "bottom," are used for clarity and convenience in understanding the present disclosure and accompanying drawings and does not connote or depend on any specific preference, orientation or order. It is understood that, although the terms "first," "second," "third," "top," "middle" and "bottom" are used herein to describe various elements, these elements should not be limited by these terms. These terms are only used to distinguish one element from another.

As used herein, the terms "horizontal" and "lateral" are defined as a plane parallel to the plane or surface of a wafer or substrate, regardless of the actual orientation of the wafer or substrate. The term "vertical" refers to a direction perpendicular to the horizontal plane as defined above. The term "height" is defined as a dimension of the structure in a direction perpendicular to the horizontal plane as defined above.

As used herein, the term "substantially," in reference to a given parameter, property or condition, means to a degree that one of ordinary skill in the art would understand that the given parameter, property, or condition is met with a small degree of variance, such as within acceptable manufacturing tolerances.

As used herein, the term "critical dimension" means and includes a dimension of a feature within design tolerances in order to achieve the desired performance of the device and to maintain the performance consistency of the device. This dimension may be obtained on a device structure as a result of different combinations of fabrication processes, which may include, but are not limited to, photolithography, etch (dry/wet), diffusion, or deposition acts.

FIGS. 2-14 are cross-sectional views of various stages of forming a plurality of floating gates for a 3D-NAND flash memory device according to one embodiment of the present disclosure.

Figure 2:
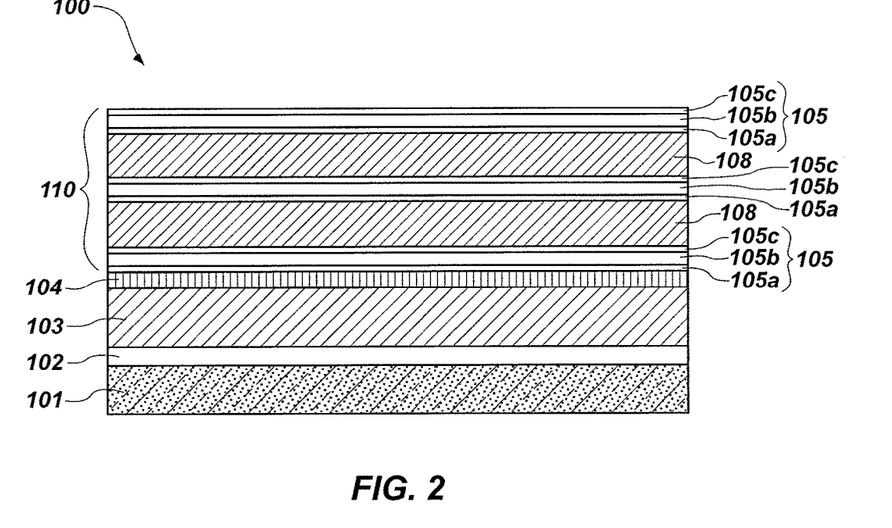
FIGS. 2-5 are cross-sectional views of various stages in the formation of a semiconductor structure having an oxide material according to an embodiment of the present disclosure.

FIG. 2 shows a semiconductor structure 100 including a source 101, a source oxide material 102, a material 103 to be used as a control gate of a select device (e.g., SGS), optionally an etch stop material 104, and a stack 110 of alternating oxide materials 105 and control gates 108 (of memory cells). The oxide material 105 may include multiple portions having different densities, which are indicated in FIG. 2 by reference numerals 105a, 105b, 105c. While the oxide portions 105a, 105b, 105c are shown in FIG. 2 as distinct, this does not necessarily imply that the oxide portions 105a, 105b, 105c are formed from different materials. Rather, the oxide portions 105a, 105b, 105c may be formed from the same material, but differing in density. By way of example, the oxide material 105 may include a top oxide portion 105c, a middle oxide portion 105b, and a bottom oxide portion 105a, wherein the densities of the top and bottom oxide portions 105c, 105a are substantially the same as each other but lower than the density of the middle oxide portion 105b. While the oxide material 105 is illustrated as including three portions having different densities, the oxide material 105 may include fewer portions or more portions, as will be described in more detail. The source 101 may be formed from doped polysilicon, tungsten silicide ($WSi_x$), or other conventional materials for sources. The etch stop material 104 may be aluminum oxide or other conventional etch stop material selected so that the materials of the stack 110 may be selectively removed without removing other materials of the semiconductor structure 100.

As used herein, the term "substrate" means and includes a base material or construction upon which additional materials are formed. The substrate may be, for example, a semiconductor substrate, a base semiconductor material on a supporting structure, a metal electrode or a semiconductor substrate having one or more materials, structures or regions formed thereon. The substrate may be a conventional silicon substrate, or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process acts may have been conducted to form materials, regions, or junctions in the base semiconductor structure or foundation. In one embodiment, the substrate is a silicon-containing material, such as a silicon substrate. The substrate may be doped or undoped. In one embodiment, the substrate may be p-doped polysilicon.

As shown in FIG. 2, the semiconductor structure 100 may include films of the respective materials. The source 101, source oxide material 102, control gate material 103, etch stop material 104, and control gate materials 108 may be formed by conventional techniques, which are not described in detail herein.

The different portions of the oxide material 105 may be formed on the etch stop material 104 by adjusting process conditions during the formation of the material. In one embodiment, the oxide material 105 may be formed using a plasma enhanced-chemical vapor deposition (PECVD) process. Each portion may be formed to a desired thickness before forming another portion. The oxide portions 105a, 105b, 105c may be of sufficiently different densities that the portions may be selectively removed when subjected to a suitable etch chemistry. The density (measured in g/cm³ unit) of each oxide portion may be determined using X-ray reflectometry (XRR), which is a conventional technique and, therefore, is not described in detail herein. In some embodiments, a density of one oxide portion may be from about six times (6×) lower to about two times (2×) higher than the density of an adjacent oxide portion(s), i.e., an oxide portion may be from about six times less dense to about two times more dense in relation to the adjacent oxide portion(s). However, it is understood that the differences in densities of oxide portions may be varied, depending on specific integration schemes of the semiconductor structure.

Various process parameters may be adjusted while forming the oxide material 105 that includes oxide portions of different densities. Non-limiting examples of such processing parameters include an amount of RF power/energy applied and RF frequency during a deposition process. By way of non-limiting example, the density of each of the oxide portions may be tailored by varying the frequency and power applied during the formation of the oxide portion. A high frequency (HF) may be an RF frequency of from about 1 MHz to about 300 MHz, and a low frequency (LF) may be an RF frequency of from about 30 KHz to about 1 MHz. A high frequency (HF) power may be an RF power of about 10 Watts to about 1000 Watts, and a low frequency (LF) power may be an RF power of from about 10 Watts to about 500 Watts. In some embodiments, the high frequency (HF) may be an RF frequency of about 13.56 MHz. In some embodiments, the low frequency (LF) may be an RF frequency of about 350 KHz.

If an oxide portion is formed using high power/low frequency, more surface impingement of ions may occur and consequently a high density of the oxide portion may be produced. Conversely, if low power/low frequency is used, less surface impingement of ions may occur and consequently a relatively lower density portion of the oxide material may be produced.

Additional processing parameters that may be adjusted include, but are not limited to, deposition time, types and ratios of component gases, pressure, flow rates of the component gases, temperature, or post-deposition treatment, etc. While these processing parameters may have a smaller effect on the density of the oxide material compared to adjusting at least one of the RF power and frequency, the density of the oxide material may be further tailored by adjusting one or more of these parameters. For instance, a longer deposition time may produce the oxide portion having a higher density compared to a shorter deposition time. Several processing parameters may be controlled to obtain the oxide material that includes at least two oxide portions of different densities. In some embodiments, the processing parameters may be programmed such that the desired density of oxide material is achieved.

The density of deposited oxide material may, optionally, be modified by post-deposition treatment. By way of non-limiting example, the post-deposition treatment may include subjecting the oxide material 105 to a mixed frequency of high frequency (HF) and low frequency (LF) plasma treatment. The mixed frequency plasma treatment may densify the top oxide portion 105c. The desired depth of densification of the oxide material 105 may be dependent on several factors including, but not limited to, the RF power employed during the post-deposition treatment, the duration of the post-deposition treatment, or both.

In some embodiments, the oxide material having at least two oxide portions of different densities may be achieved by adjusting the RF power during the deposition and applying a post-deposition treatment using a mixed frequency plasma treatment. In some embodiments, the oxide material having at least two oxide portions of different densities may be obtained by forming the oxide material at an RF power from about 60 Watts to about 130 Watts, and applying a postdeposition treatment from about two seconds to about 120 seconds using a mixed frequency plasma treatment having a high frequency/lower frequency power (HF/LF) combination from about 350/0 Watts to 1200/100 Watts.

In some embodiments, the oxide material having at least two oxide portions of different densities may be achieved by depositing the oxide material using high frequency (HF), and then subjecting the oxide material to a high frequency (HF) plasma treatment. In some embodiments, this may be achieved by depositing the oxide material using high frequency (HF), and then subjecting the oxide material to a mixed frequency of high frequency (HF) and low frequency (LF) plasma treatment. In some embodiments, this may be achieved by depositing the oxide material using a mixed frequency of high frequency (HF) and low frequency (LF), and then subjecting the oxide material to a high frequency (HF) plasma treatment. In some embodiments, this may be achieved by depositing the oxide material using a mixed frequency of high frequency (HF) and low frequency (LF), and then subjecting the oxide material to a mixed frequency of high frequency (HF) and low frequency (LF) plasma treatment.

In some embodiments, the oxide material may be deposited using tetraethyl orthosilicate (TEOS) and oxygen. In some embodiments, the oxide material may be deposited using silane and oxygen. In one embodiment, the oxide material may be silicon oxide.

In some embodiments, the formation of oxide material having at least two oxide portions of different densities may be conducted in one reaction chamber. In these in-situ deposition embodiments, the processing parameters may be adjusted to form one oxide portion and then adjusted for the formation of another oxide portion having a different density.

Alternatively, in some embodiments the formation of oxide material having at least two oxide portions of different densities may be conducted in more than one reaction chamber. By way of non-limiting example, one oxide portion of the oxide material may be formed in a first reaction chamber, and then another oxide portion of different density may be formed in a second reaction chamber.

The control gate material 108 may be formed over the oxide material 105 by any conventional method and, therefore, is not described in detail herein. The control gate material may be of any known conductive materials. Non-limiting examples of such conductive materials may include n-doped polysilicon, p-doped polysilicon, or undoped polysilicon. In one embodiment, the control gate material may be n-doped polysilicon. The formation of the oxide materials 105 and control gate materials 108 may be repeated to create the stack 110 of alternating oxide materials 105 and control gates 108.

Figure 3:
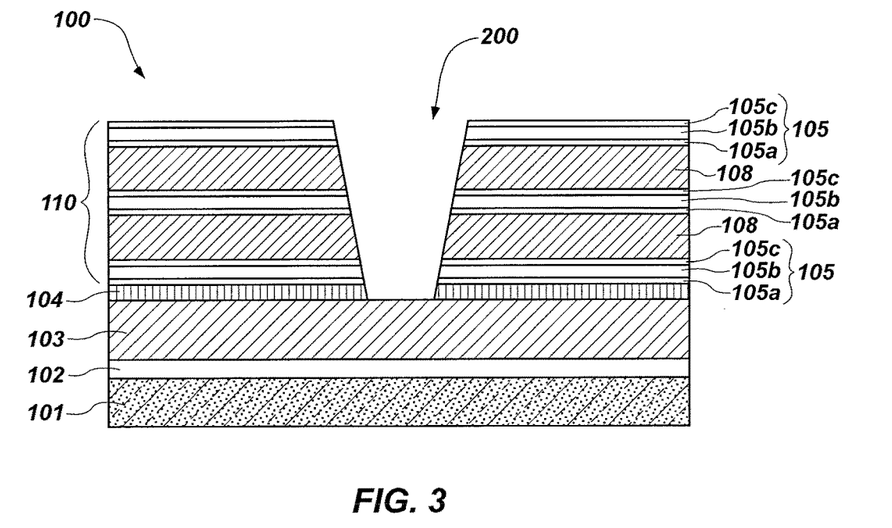

Referring to FIG. 3, the semiconductor structure 100 of FIG. 2 is subjected to a single etch process or multiple etch processes to create an opening 200 through the stack 110 of alternating oxide materials 105 and control gate materials 108 that stops in the etch stop material 104. By way of example, the stack 110 may be etched using an anisotropic dry etch process. A surface of the control gate material 103 may be exposed following the etch process. The opening 200 may be formed using any conventional etch chemistry (i.e., a reactive ion etch), and therefore is not described in detail herein. Although the structure 100 of FIG. 3 shows only one opening 200, it is understood that the semiconductor structure 100 may include more than one opening.

Figure 4:
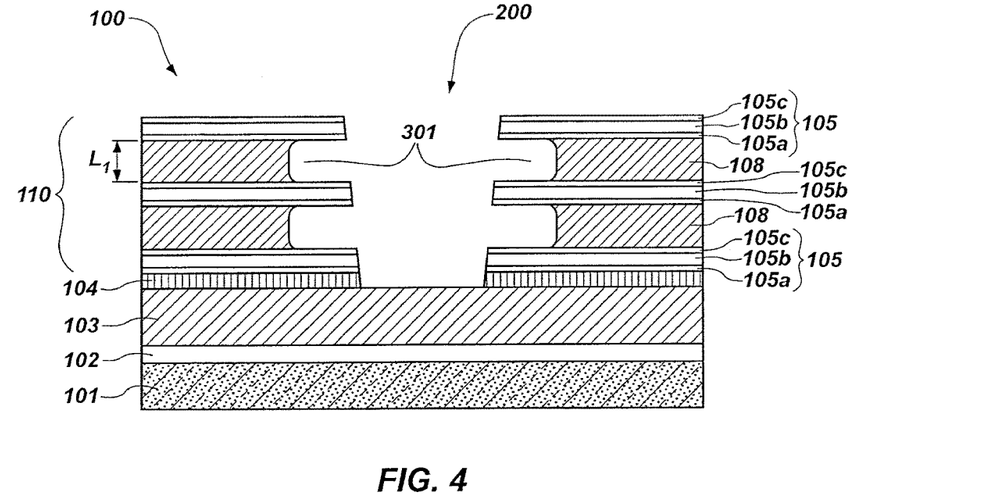

As shown in FIG. 4, a portion of the control gate materials 108 in the stack 110 may be selectively removed relative to adjacent oxide materials 105 to create control gate recesses 301 having a height of $L_1$, where the upper and lower boundaries of the control gate recesses 301 are defined by sidewalls of the adjacent oxide materials 105. The height $L_1$ of the control gate recesses 301 may be substantially the same as the thickness of the adjacent control gate materials 108. The control gate recesses 301 may be formed by laterally removing portions of the control gate materials 108. In some embodiments, the control gate recesses 301 may be formed by wet etching the semiconductor structure 100 using a solution of tetramethylammonium hydroxide (TMAH).

Figure 5:
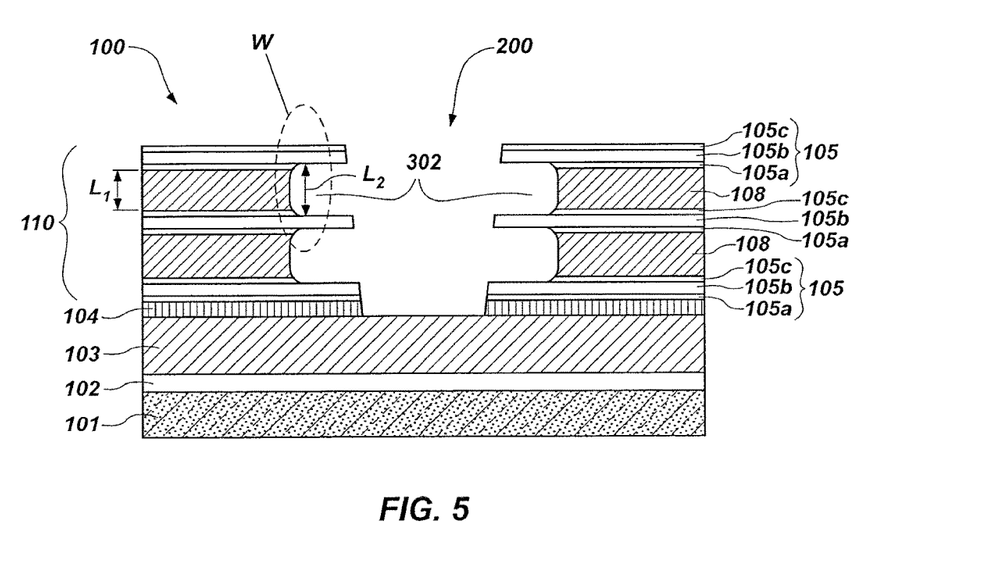

As shown in FIG. 5, a portion of the oxide materials 105 in the stack 110 may be removed to increase the height of the control gate recesses 301. Portions of the oxide materials 105 adjacent to the control gate recesses 301 may be removed using any conventional wet etch chemistry for an oxide material. In some embodiments, the portions of the oxide materials may be removed by etching with an etchant selected from the group consisting of hydrogen fluoride (HF) solution, and buffered oxide etch (BOE) solution comprising HF and $NH_4F$. Since the oxide material 105 has oxide portions of different densities, the oxide portions may be removed at different rates when exposed to an etch chemistry. By way of example, a portion of the top and bottom oxide portions 105c, 105a may be removed without removing a portion of the middle oxide portion 105b. The top and bottom oxide portions 105c, 105a above and below the control gate recesses 301 may be removed by the etch chemistry, while portions of the top and bottom oxide portions 105c, 105a above and below the control gate materials 108 may remain.

As shown in FIG. 5, the top and bottom oxide portions 105a, 105c may be removed such that the resulting control gate recesses 302 have a height of $L_2$, which is greater than the original height $L_1$ of the control gate recesses 301. The amount of oxide material 105 removed, the height $L_2$ of the control gate recesses 302, and the profile of the control gate recesses 302 may be controlled by various factors including, but not limited to, the densities of each oxide portion of the oxide material 105, the thickness of each oxide portion in the oxide material 105, or the etching types and conditions. The heights and profiles of the control gate recesses 302 may be dependent on the densities of each oxide portion in the oxide material 105, as shown and discussed in more detail with reference to FIGS. 6A-6D.

Figure 6A:
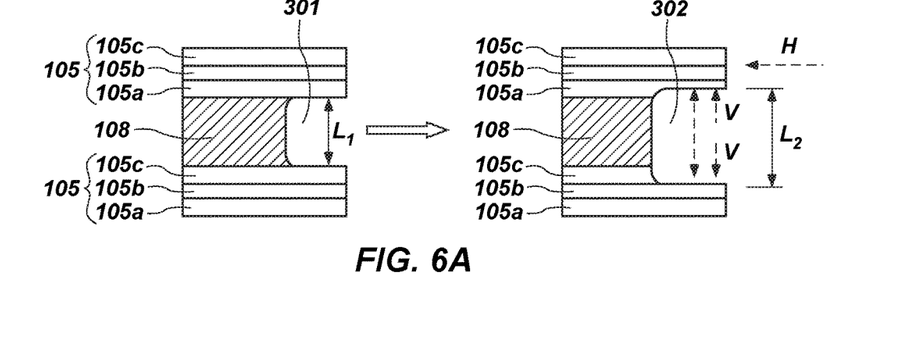
FIGS. 6A-6D are enlarged cross-sectional views for the removal of various portions of the oxide materials after the formation of control gate recesses.

FIGS. 6A-6D are enlarged views of the area labeled "W" in FIG. 5. In FIG. 6A, the oxide material 105 includes the top oxide portion 105c, the middle oxide portion 105b, and the bottom oxide portion 105a, wherein the densities of the top and bottom oxide portions 105c, 105a are substantially the same, and the density of the middle oxide portion 105b is higher than that of the top and bottom oxide portions 105c, 105a. The top oxide portion 105c of one oxide material 105 and the bottom oxide portion 105a of another oxide material 105 define the boundaries of each control gate recess 301. Since the top and bottom oxide portions 105c, 105a adjacent the control gate recess 301 have about the same density, portions of these materials are removed at substantially the same rate while other exposed materials, including middle oxide portion 105b, are removed at a substantially slower rate. Therefore, the amounts of removal in the vertical direction for the top and bottom oxide portions 105c, 105a are substantially the same. However, portions of the top and bottom oxide portions 105c, 105a overlying or underlying the control gate material 108 may remain in place, in addition to middle oxide portion 105b. While portions of the oxide material 105 may also be removed in the horizontal direction, which leads to a loss in critical dimension (CD), the loss in CD may be compensated for by appropriately selecting the initial CD of the opening 200. Thus, horizontal etching of the oxide material 105 of the structure in FIG. 6A may occur with less effect on the CD than the horizontal etching of the oxide material 105 of the structure in FIG. 6B. It is desirable to minimize the loss of critical dimension to comply with design rules/requirements and, therefore, ensure that the desired device performance is achieved.

Therefore, the dimension, height and profile of the control gate recess 302 may be controlled by appropriate selection of the type and density of oxide portions (e.g., 105a, 105b, 105c) in the oxide material 105, the thickness of each oxide portion, the etching conditions, and other various known factors.

While FIGS. 2-5 have been described and illustrated above as including top oxide portion 105a, middle oxide portion 105b, and bottom oxide portion 105c, where the top and bottom oxide portions 105a and 105b have lower densities than the middle oxide portion 105b, other configurations and other relative densities of the oxide portions may be used depending on the intended use of the semiconductor structure 100. In other embodiments and as explained in more detail below, the oxide material 105 may include a single oxide portion or two oxide portions having different densities.

Figure 6B:
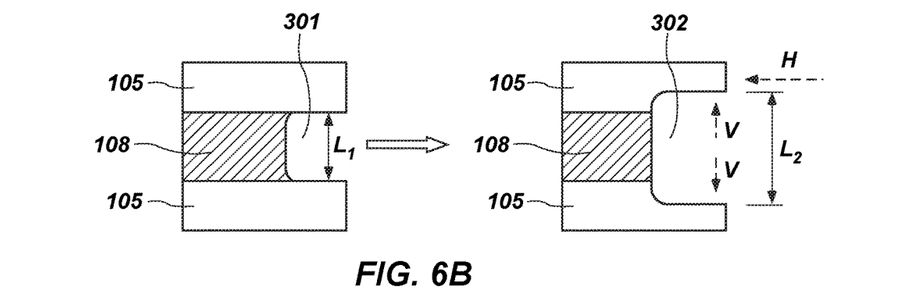

FIG. 6B, the oxide material 105 includes a substantially uniform oxide material with substantially the same density across the height of the oxide material 105, which provides the semiconductor structure 100 of FIG. 1 after further processing steps. During the wet etch process of FIG. 5, a portion of the oxide material 105 may be removed in a horizontal direction (shown as arrow "H") and in a vertical direction (shown as arrow "V") such that the height $L_2$ of the control gate recess 302 is greater than the height $L_1$. As the oxide material 105 in the stack 110 is made of an oxide material having a single density, the amount of removal in the vertical and horizontal directions is substantially the same.

Figure 6C:
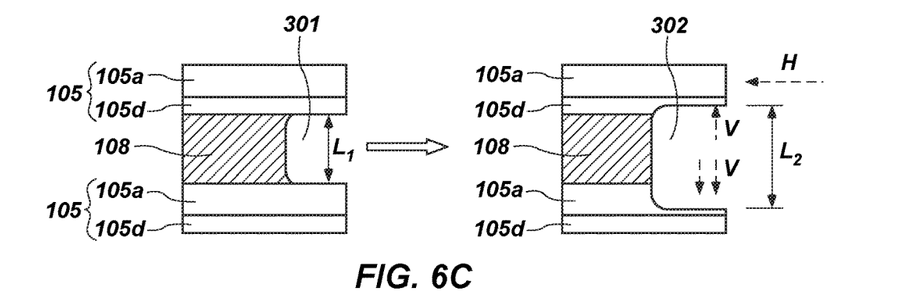

In FIG. 6C, the oxide material 105 includes an oxide portion 105a over an oxide portion 105d, wherein the oxide portion 105a has a lower density than the oxide portion 105d. The oxide portion 105d of the oxide material 105 is in direct contact to the upper boundary of the adjacent control gate 108, while the oxide portion 105a is in direct contact to the lower boundary of the adjacent control gate 108. Since the oxide portion 105a has a lower density than the oxide portion 105d, the oxide portion 105a may be removed at a faster rate than the oxide portion 105d when exposed to the same etch chemistry. Thus, the amount of etching in the vertical direction for the oxide portions 105a, 105d adjacent the control gate recesses 302 are not the same when exposed to the same etch chemistry. As shown, the etching of the oxide portion 105a in the vertical direction is faster than the etching of the oxide portion 105d in the vertical direction due to the different densities of the oxide portion 105a, 105d.

Figure 6D:
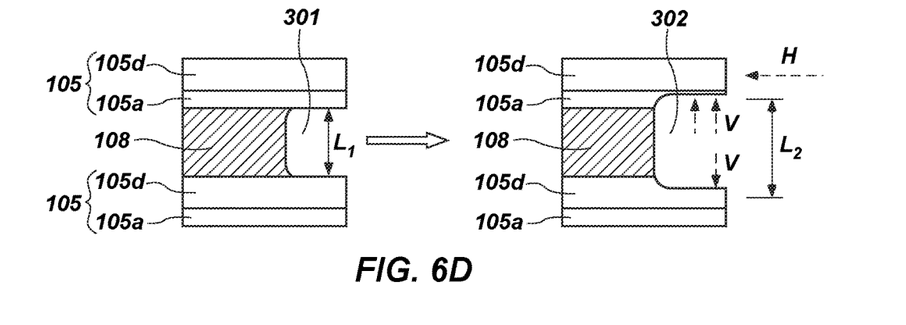

In FIG. 6D, the oxide material 105 includes an oxide portion 105d over an oxide portion 105a, wherein the oxide portion 105a has a lower density than the oxide portion 105d. The oxide portion 105a of the oxide material 105 is in direct contact to the upper boundary of the adjacent control gate 108, while the oxide portion 105d is in direct contact to the lower boundary of adjacent control gate 108. Since the oxide portion 105a has a lower density than the oxide portion 105d, the oxide portion 105a is removed at a faster rate than the oxide portion 105d when exposed to the same etch chemistry. Thus, the amount of etching in the vertical direction for the oxide portions 105a, 105d adjacent the control gate recesses 302 are not the same when exposed to the same etch chemistry. As shown, the etching of the oxide portion 105a in the vertical direction is faster than the etching of the oxide portion 105d in the vertical direction due to the different densities of the oxide portions 105a, 105d.

In some embodiments, the oxide material 105 may include the top oxide portion 105c, the middle oxide portion 105b and the bottom oxide portion 105a, wherein the densities of the top and bottom oxide portions 105c, 105a are substantially the same, and the densities of the top and bottom oxide portions 105c, 105a are up to about six times lower (i.e., 6x less dense) than the density of the middle oxide portion 105b.

In some embodiments, the oxide material 105 may include a top oxide portion 105c, middle oxide portion 105b and bottom oxide portion 105a, wherein the density of the top oxide portion 105c is from about six times lower (i.e., 6× less dense) to about two times higher (i.e., 2× more dense) than the density of the middle oxide portion 105b, and the density of the bottom oxide portion 105a is from about six times lower (i.e., 6× less dense) to about two times higher (i.e., 2× more dense) than the density of the middle oxide portion 105b. The densities of the top portion 105c and the bottom portion 105a may or may not be the same as each other.

Figure 7:
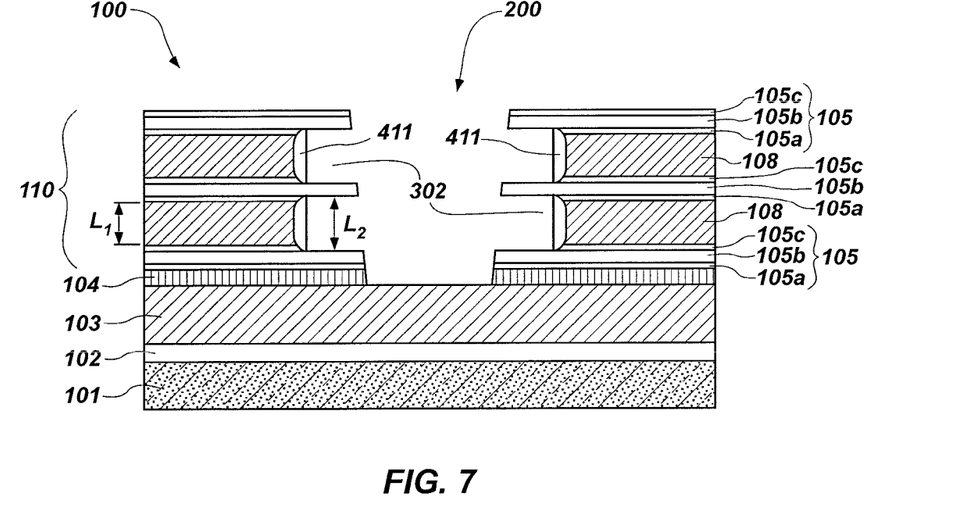
FIGS. 7-14 are cross-sectional views of various stages in the formation of a semiconductor structure having an oxide material according to an embodiment of the present disclosure.
Figure 8:
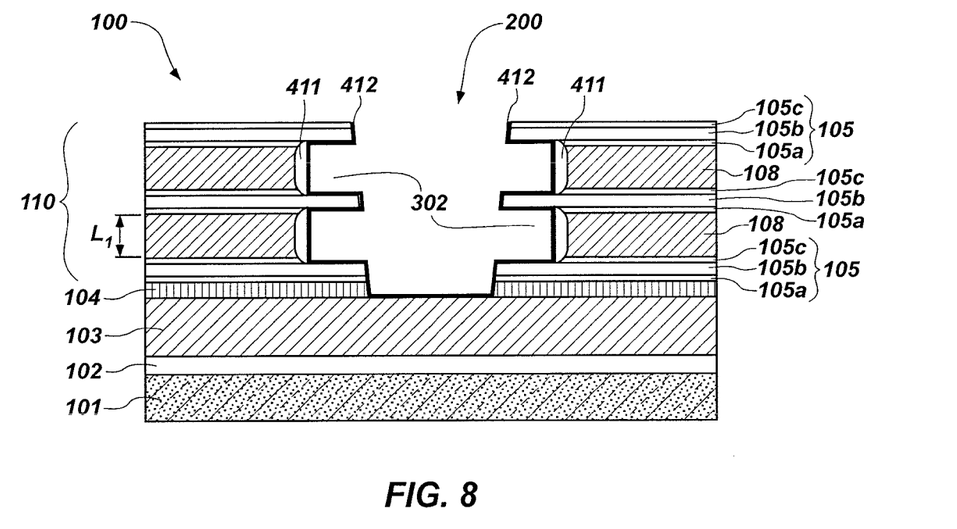
Figure 9:
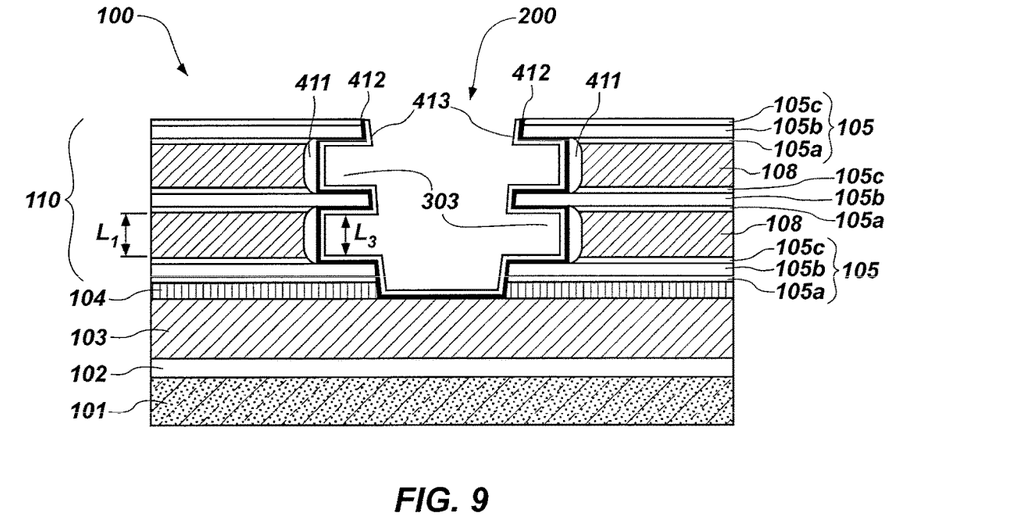

Referring now to FIGS. 7-9, the charge blocking material, such as inter-poly dielectric (IPD) material, may be formed on the exposed surface of the control gate recesses 302 and the sidewalls and floor of the opening 200 of the semiconductor structure 100 to provide the semiconductor structure of FIG. 9. In one embodiment of the present disclosure, the charge blocking material is an inter-poly dielectric (IPD) material that includes dielectric materials 411, 412 and 413. In one embodiment, the charge blocking material is an inter-poly dielectric (IPD) material consists of oxide 411-nitride 412-oxide 413 (ONO) materials.

In FIG. 7, a first dielectric material 411, such as an oxide material, may be selectively formed on the sidewalls of the control gate material 108. By way of non-limiting examples, the first dielectric material 411 may include silicon oxide, silicon nitride, silicon oxynitride, or other high-k insulating materials.

In some embodiments, the first dielectric material 411 may be silicon oxide. Any conventional method for forming a dielectric material may be used. By way of non-limiting example, the dielectric material may be formed by chemical vapor deposition (CVD), atomic layer deposition (ALD), physical vapor deposition (PVD), or combinations thereof. To selectively form the first dielectric material 411, the first dielectric material 411 may be grown on the control gate material 108. In one embodiment, the first dielectric material 411 may be grown on the exposed surface of control gate material 108 through an In Situ Steam Generation (ISSG) process, physical vapor deposition (PVD), furnace growth (diffusion), or combinations thereof.

In FIG. 8, a second dielectric material 412 such as a nitride material is formed substantially conformally on the exposed surfaces of the oxide material 105, the first dielectric material 411 in the control gate recesses 302, the etch stop material 104 and the exposed surface of the control gate material 103. In some embodiments, the second dielectric material 412 is silicon nitride. Any conventional method for forming the nitride material may be used and, therefore, is not described in detail herein.

A third dielectric material 413 may be formed substantially conformally over the second dielectric material 412, providing the semiconductor structure 100 of FIG. 9. Any conventional method for forming the third dielectric material 413 may be used, such as chemical vapor deposition (CVD), atomic layer deposition (ALD), physical vapor deposition (PVD), or combinations thereof. The third dielectric material 413 may include silicon oxide, silicon nitride, silicon oxynitride, or other high-k insulating materials. In some embodiments, the third dielectric material 413 is silicon oxide. The first and third dielectric materials 411, 413 may be independently selected so that the same or different oxide materials are used. Depending on the materials selected, the inter-poly dielectric (IPD) material may include an oxide-nitride-oxide (ONO) material of the first dielectric oxide material 411-the second dielectric nitride material 412-the first dielectric oxide material 413 on at least the area proximate the control gate recesses 303 on the sidewalls of the opening 200. The IPD material (411, 412, 413) may occupy the area in the control gate recesses 303 such that the height $L_3$ of the resulting control gate recesses is substantially equal to the height $L_1$ of the adjacent control gate material 108.

Figure 10:
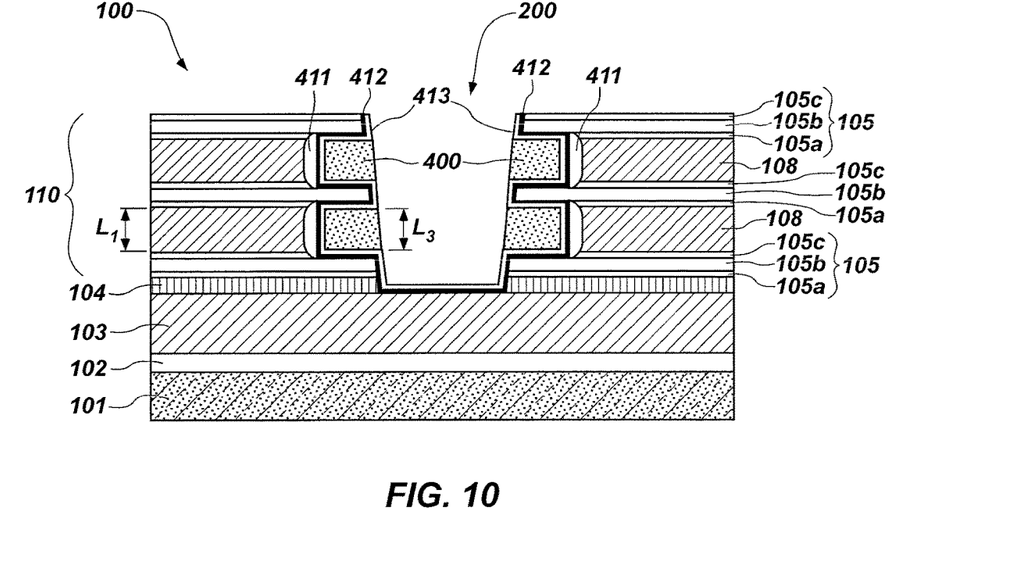

Referring to FIG. 10, floating gate material 400 may be formed in the control gate recesses 303 adjacent to the third dielectric material 413 to substantially fill the remaining volume of the control gate recesses 303. The floating gate material 400 may be separated from the adjacent control gate material 108 by the IPD material (411, 412, 413). Thus, the semiconductor structure 100 includes floating gates 400 that are discrete and isolated from one another and from the control gates 108 by IPD material (411, 412, 413). By way of non-limiting example, the floating gate material 400 may include silicon, germanium, or silicon germanium. In one embodiment, the floating gate material 400 is polysilicon, such as n-doped polysilicon, p-doped polysilicon, or undoped polysilicon. The control gate material 108 and the floating gate material 400 may be independently selected so that the same or different materials are used. In one embodiment, the control gate material 108 and the floating gate material 400 are polysilicon. Any conventional method for forming the floating gate material 400 may be used and, therefore, is not described in detail herein.

After substantially filling the control gate recesses 303, any excess floating gate material 400 may be removed using vapor ammonia, a mixture of ammonium fluoride and nitric acid ($NH_4F/HNO_3$), an ozone or hydrofluoric acid (HF) mix or cycle, a mixture of hydrofluoric acid and nitric acid ($HF/HNO_3$), or a tetramethyl ammonium hydroxide (TMAH) process. The process used to remove any excess floating gate material 400 may be a function of the doping of the floating gate material 400. For example, if the floating gate material 400 is an n-doped polysilicon, the TMAH process may be used to remove the excess floating gate material 400. A vertical, exposed surface of the floating gate material 400 may be substantially coplanar with a vertical, exposed surface of the third dielectric material 413. As shown in FIG. 10, the height $L_3$ of floating gate 400 may be substantially the same as the height $L_1$ of control gate material 108.

Figure 11:
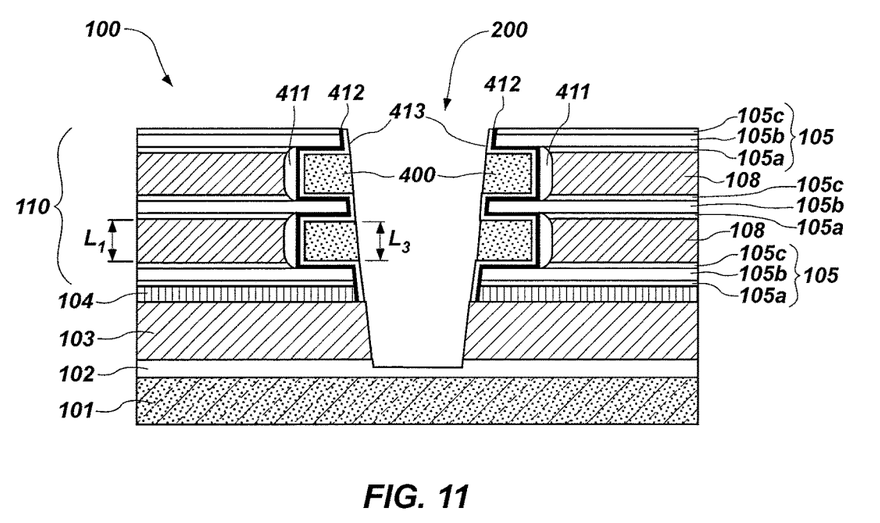

Referring to FIG. 11, the depth of the opening 200 may then be increased such that the opening 200 extends through the control gate material 103 and into at least a portion of the source oxide material 102. The depth of the opening 200 may be increased by etching the control gate material 103 and the source oxide material 102 by conventional techniques, which are not described in detail herein.

Figure 12:
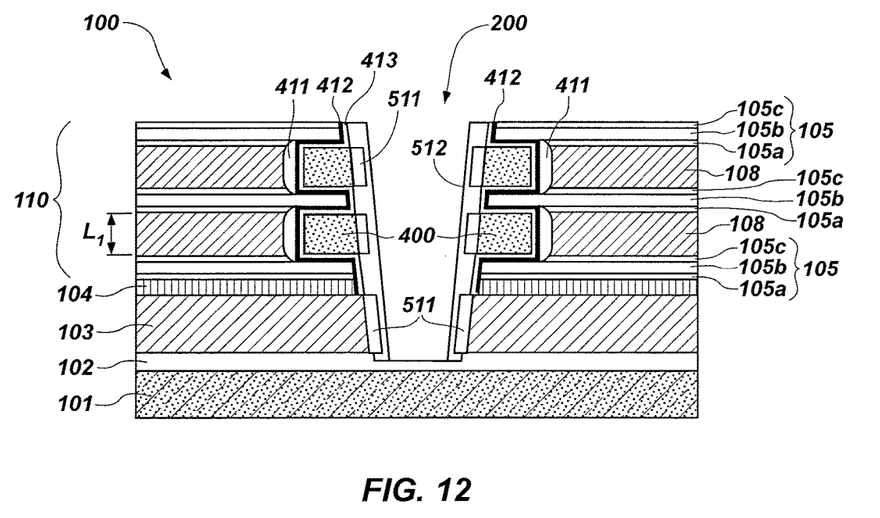

In some embodiments as shown in FIG. 12, a tunnel dielectric material 511 (hereinafter sometimes referred to as "tunnel oxide material" by example) may be formed on the exposed surfaces of the floating gates 400 and the control gate material 103. In some embodiments, the tunnel oxide material 511 may be silicon oxide. Any conventional method for forming a tunnel oxide material may be used. To selectively form the tunnel dielectric material 511, the tunnel oxide material 511 may be grown on the exposed surfaces of the floating gates 400 and the control gate material 103.

In some embodiments, a liner material, such as a polysilicon liner, may be formed on the exposed surface of the opening 200, such as on the sidewalls of the opening 200. For example, as shown in FIG. 12, a liner material 512 may be formed on the exposed surfaces of the third dielectric material 413 and the tunnel oxide material 511, and the exposed sidewalls of source oxide material 102. The liner material 512 may protect oxide materials from downstream process acts.

Figure 13:
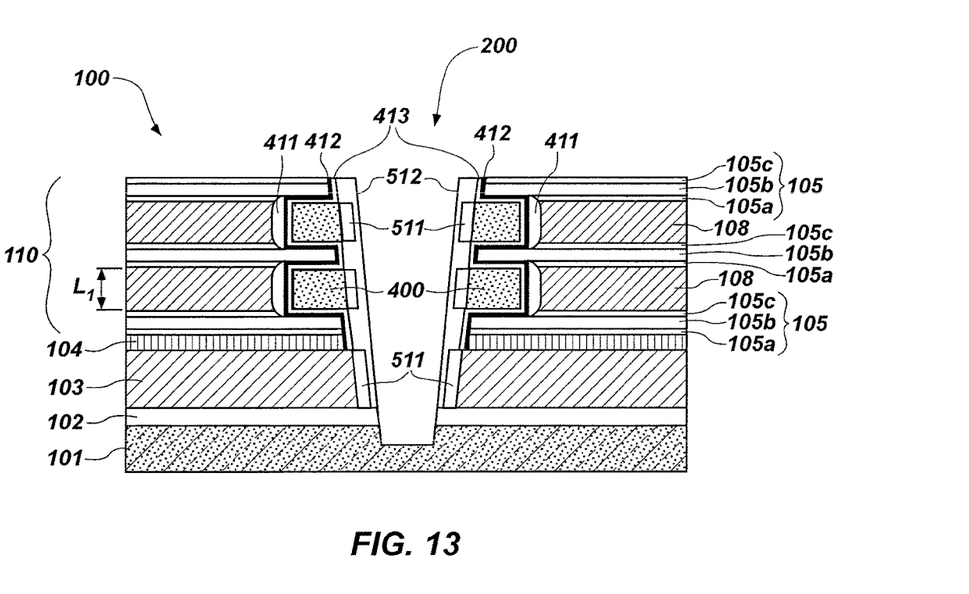

Referring to FIG. 13, the depth of the opening 200 may be extended through the source oxide material 102 to allow electrical contact to the source 101. As shown in the embodiment of FIG. 13, the remaining thickness of the source oxide material 102 and at least a portion of the source 101 may be removed such that the opening 200 extends through the stack 110, the etch stop material 104, the control gate material 103, the source oxide material 102 and at least a portion of the source 101. Any conventional method for removing the source oxide material 102 and at least a portion of the source 101 may be used and, therefore, is not described in detail herein.

Figure 14:
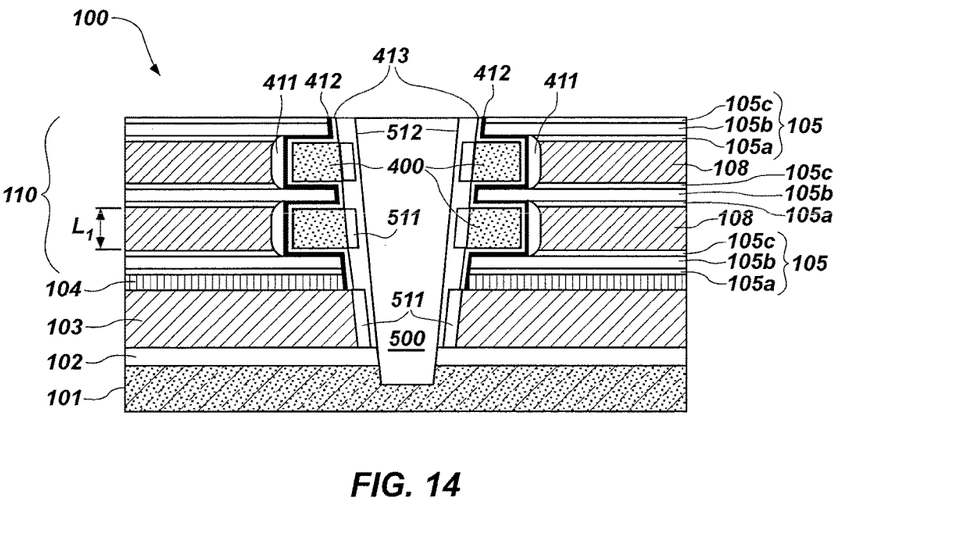

In FIG. 14, a channel material 500 may be formed to substantially fill the opening 200 of the semiconductor structure 100. By way of non-limiting example, the channel material 500 may be conductively doped polysilicon. Any conventional method for forming the channel material 500 may be used and, therefore, is not described in detail herein.

In some embodiments, the semiconductor structure 100 of FIG. 13 may be subjected to a cleaning process prior to substantially filling the opening 200 with the channel material 500. Any conventional method for cleaning process may be used and, therefore, is not described in detail herein.

As described herein, one or more embodiments of the present disclosure may enable an increased height of a floating gate to be formed, without jeopardizing the critical dimensions and without the addition of complex acts to the process. By modifying the process to form the floating gates and control gates at the same height, the floating gates and control gates may be aligned.

Although various embodiments herein have described using an oxide material having portions of different densities as a dielectric material, it is understood that other dielectric materials may be used. The dielectric material may be any insulative material that can be formed by a PECVD process in which processing parameters, such as power and frequency, are adjustable and result in portions of the insulative material having different densities. By way of non-limiting examples, the dielectric material may be silicon oxide, silicon nitride, silicon oxynitride, or other high-k insulating material.

A semiconductor structure may include a stack of alternating oxide materials and control gates, each of the oxide materials comprising at least two oxide portions of different densities; charge storage structures (e.g., floating gates or charge traps) laterally adjacent to the control gates; a charge block material between each of the charge storage structures and the laterally adjacent control gates; and a pillar extending through the stack of alternating oxide materials and control gates.

A semiconductor structure may include a stack of alternating dielectric materials and control gates, the dielectric material comprising a top portion, a middle portion and a bottom portion, the top and bottom portions having lower densities than the middle portion; a charge storage structure having a height substantially the same as the height of an adjacent control gate; a charge block material between the charge storage structure and the adjacent control gate; and a channel material extending through the stack of alternating oxide materials and control gates.

FIGS. 15-18 are cross-sectional views of some stages of forming a plurality of floating gates for a 3D-NAND flash memory device according to one embodiment of the present disclosure, wherein the alternating dielectric materials of the stack may include at least two portions of different materials having different rates of removal when exposed to a single etch chemistry (i.e., the same etch chemistry). The different materials in the alternating dielectric materials may have substantially the same density or different densities.

Figure 15:
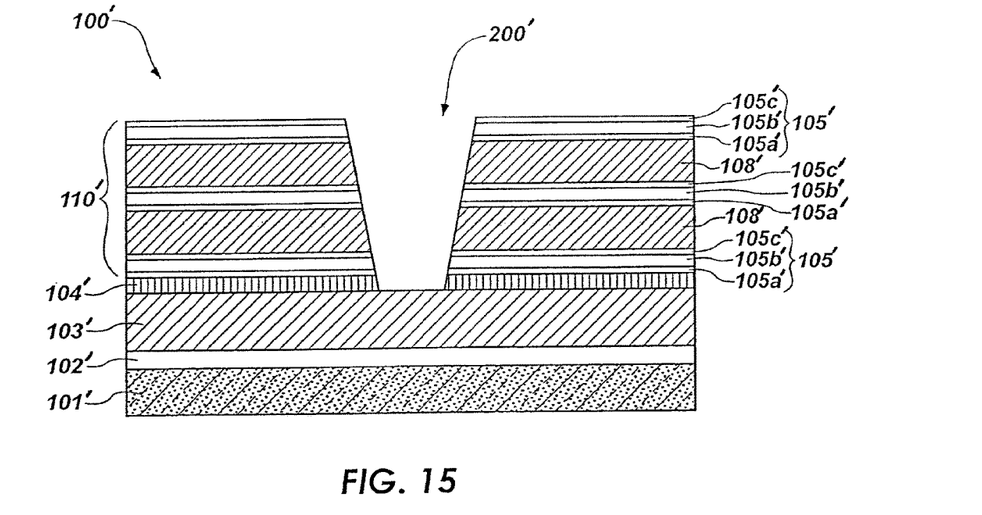
FIGS. 15-18 are cross-sectional views of various stages in the formation of a semiconductor structure according to another embodiment of the present disclosure, wherein the alternating dielectric material comprises at least two portions of different materials having different rates of removal when exposed to the same etch chemistry.

FIG. 15 shows a semiconductor structure 100' including a source 101', a source oxide material 102', a material 103' to be used as a control gate of a select device (e.g., SGS), optionally an etch stop material 104', a stack 110' of alternating dielectric materials 105' and control gates 108' (of memory cells), and an opening 200' extending through the stack 110'. The dielectric material 105' may include at least two portions of different materials having different rates of removal when exposed to the same etch chemistry. The different materials in the dielectric material may or may not have same density. Non-limiting examples of the materials suitable for the different portions of the alternating dielectric material may include an oxide-based material, a nitride-based material, an oxynitride-based material, or combinations thereof.

In some embodiments, each of the dielectric materials of the stack may include at least a first material portion and a second material portion, wherein the first material portion has an etch rate at least about two times greater than that of the second material portion when exposed to same etch chemistry. However, it is understood that the differences in removal rates of dielectric material portions may be varied, depending on specific integration schemes of the semiconductor structure.

By way of non-limiting example, as shown in FIG. 15, the dielectric material 105' may include a top material portion 105c', a middle material portion 105b', and a bottom material portion 105a', wherein when exposed to the same etch chemistry, the top material portion 105c' has substantially the same rate of removal as the bottom material portion 105a' and a higher rate of removal than that of the middle material portion 105b'. As a non-limiting example, the top and bottom material portions (105c' and 105a') of the dielectric material 105' may include silicon oxide ($SiO_x$) material, and the middle material portion 105b' may include silicon nitride ($SiN_y$) material. As another non-limiting example, the top and bottom material portions (105c' and 105a') of the dielectric material 105' may include silicon oxide ($SiO_x$) material and the middle material portion 105b' may include silicon oxynitride ($SiO_xN_y$) material.

Although the structure 100' of FIG. 15 shows only one opening 200', it is understood that the semiconductor structure 100' may include more than one opening. Furthermore, while the dielectric material 105' is illustrated in FIG. 15 as including three portions, it is understood that the dielectric material 105' may include fewer than three material portions or more than three material portions.

Figure 16:
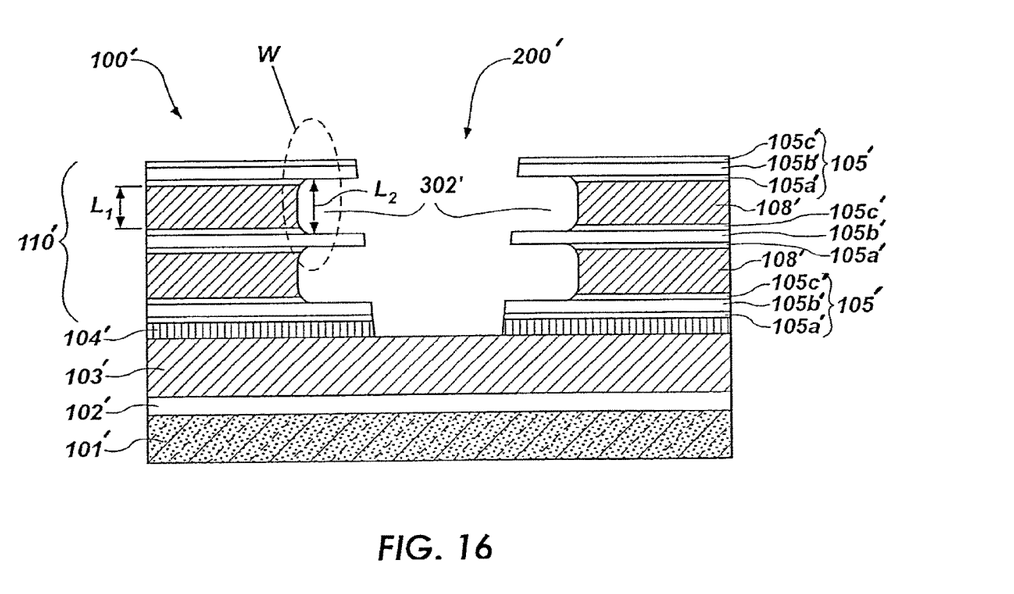

As shown in FIG. 16, portions of the control gate materials 108' and portions of the dielectric materials 105' in the stack 110' may be removed to create control gate recesses 302', where the upper and lower boundaries of the control gate recesses 302' are defined by sidewalls of the adjacent dielectric materials 105'. By way of non-limiting example, as shown in FIG. 16, the top and bottom material portions (105c', 105a') of the dielectric materials 105' may be removed without substantially removing a portion of the middle material portion 105b' to provide such that the control gate recesses 302' having a height of $L_2$, which is greater than the height $L_1$ of the adjacent control gate 108'. As a non-limiting example, when the top and bottom material portions (105c' and 105a') of the dielectric material 105' are composed of silicon oxide ($SiO_x$) material and the middle material portion 105b' is composed of silicon nitride ($SiN_y$) material, the silicon oxide ($SiO_x$) material of the top and bottom material portions (105c' and 105a') may be removed at a faster rate than the silicon nitride ($SiN_y$) material of the middle material portion 105b' by etching with an etchant selected from the group consisting of hydrogen fluoride (HF) solution, and buffered oxide etch (BOE) solution comprising HF and $NH_4F$.

Therefore, the dimension, height and profile of the control gate recess 302' may be controlled by appropriate selection of materials for each of the dielectric portions (e.g., 105a', 105b', 105c') in the dielectric material 105', the thickness of each material portion, the etching conditions, and other various known factors.

Figure 17:
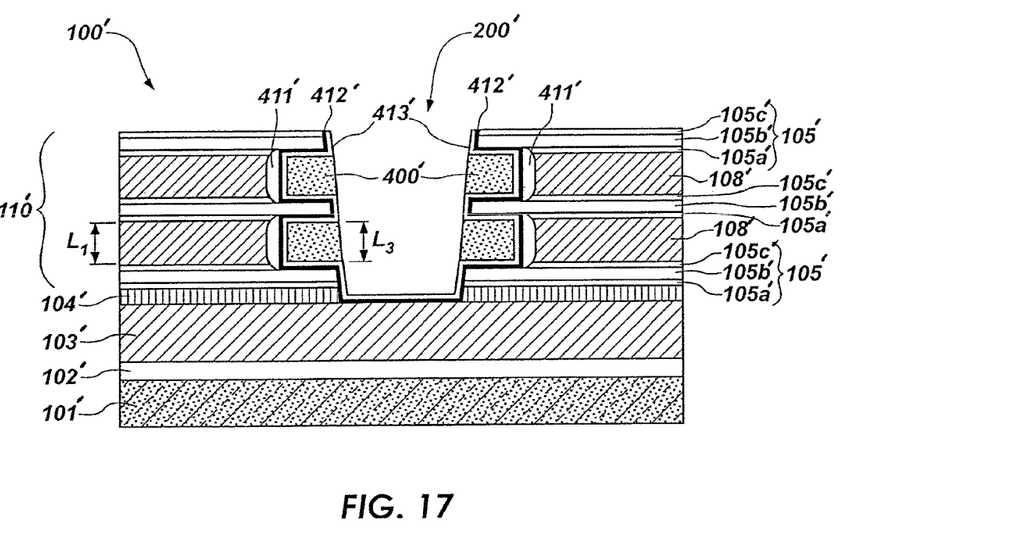

Referring to FIG. 17, a charge blocking trap structure (411'-412'-413'), such as inter-poly dielectric (IPD) material, may be formed on the exposed surface of the control gate recesses 302' to occupy the area in the control gate recesses 302' such that the height $L_3$ of the resulting control gate recesses is substantially equal to the height $L_1$ of the adjacent control gate material 108'. The floating gate material 400' may then be formed in the control gate recesses to substantially fill the remaining volume of the control gate recesses.

Figure 18:
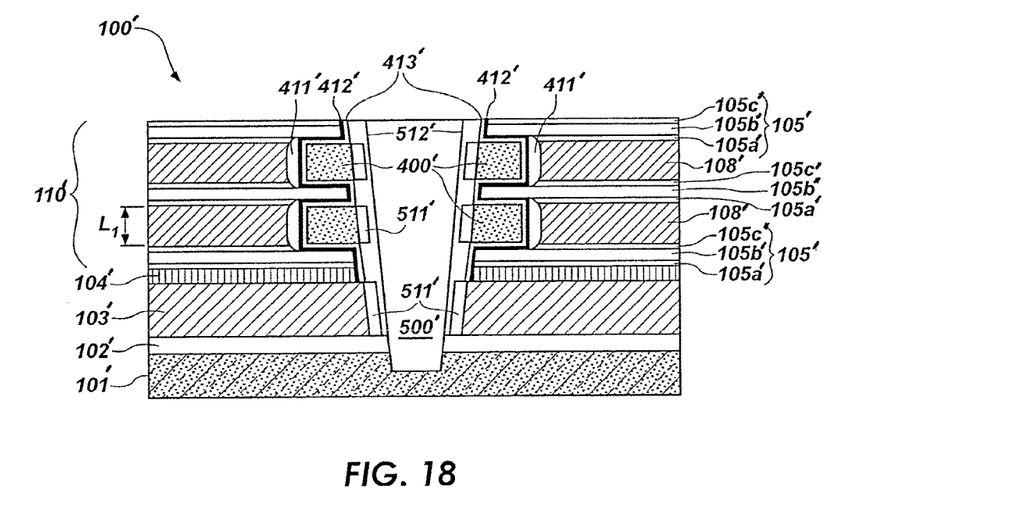

In some embodiments as shown in FIG. 18, a tunnel dielectric material 511' may be formed on the exposed surfaces of the floating gates 400' and the control gate material 103'. A liner material 512' may be formed on the exposed surface of the opening 200', and a channel material 500' may be formed to substantially fill the opening 200'.

A semiconductor structure may include a stack of alternating dielectric materials and control gates, charge storage structures laterally adjacent to the control gates and having substantially the same height as the respective laterally adjacent control gate, a charge block material between each of the charge storage structures and the respective laterally adjacent control gate, and a pillar extending through the stack of alternating dielectric materials and control gates, wherein each of the dielectric materials of the stack comprises at least two portions of different materials having different rates of removal when exposed to the same etch chemistry.

The semiconductor structure (100 of FIG. 14, 100' of FIG. 18) may be subjected to further processing for production of a semiconductor device. In one embodiment, the semiconductor structure (100, 100') may be further processed by conventional techniques to form a semiconductor device, such as a 3D-NAND flash memory device. However, while the embodiments are described in connection with 3D-NAND flash memory devices, the disclosure is not so limited. The disclosure is applicable to other semiconductor structures and memory devices which may employ charge storage structures.

FIGS. 2-18 illustrate some embodiments of forming a semiconductor structure (100, 100') having charge storage structures (400, 400') for a 3D-NAND device, and do not necessarily limit the number of alternating oxide materials (105, 105') and control gate materials (108, 108') in the stack (110, 110'). In addition, the locations, numbers, and shapes of the charge storage structures (400, 400'), or the profile and shape of the channel material (500, 500') are not limited to the illustrated embodiments.

A method of forming a semiconductor structure can include utilizing an oxide material having at least two oxide portions of different densities, in combination with an optimized wet etching process for such oxide material to increase the height of charge storage structures formed between the oxide materials, to sculpt the profile of charge storage structures to the predetermined structure, or both.

One such method modifies the deposition process of oxide material and adds a wet etching step of the oxide material prior to formation of charge blocking material in the control gate recesses. Such a method may allow for an increased height of a charge storage structure without jeopardizing the critical dimensions and without complex additional steps.

While the present disclosure is susceptible to various modifications and alternative forms, specific embodiments have been shown by way of example in the drawings and have been described in detail herein. However, the present disclosure is not intended to be limited to the particular forms disclosed. Rather, the present disclosure is to cover all modifications, equivalents, and alternatives falling within the scope of the present disclosure as defined by the following appended claims and their legal equivalents.

The invention claimed is:

1. A semiconductor structure, comprising:
   a stack of alternating oxide materials and control gates, each of the oxide materials of the stack comprising at least two oxide portions of different densities;
   charge storage structures laterally adjacent to the control gates, the charge storage structures comprising a uniform height across a length thereof and no portion of the control gates overlying or underlying the charge storage structures, and each of the charge storage structures having the same height as the respective laterally adjacent control gate;
   a charge block material between each of the charge storage structures and the respective laterally adjacent control gate; and
   a pillar extending through the stack of alternating oxide materials and control gates.

2. The semiconductor structure of claim 1, wherein a density of one oxide portion in the at least two oxide portions is from about six times lower to about two times higher than a density of an adjacent oxide portion in the at least two oxide portions.

3. The semiconductor structure of claim 1, wherein at least some of the oxide materials of the at least two oxide portions comprise a top oxide portion, a middle oxide portion and a bottom oxide portion, and a density of the top oxide portion is substantially equal to a density of the bottom oxide portion and lower than a density of the middle oxide portion.

4. The semiconductor structure of claim 1, wherein at least some of the oxide materials of the at least two oxide portions comprise a top oxide portion, a middle oxide portion and a bottom oxide portion, and a density of the middle oxide portion is higher than a density of the top oxide portion and a density of the bottom oxide portion.

5. The semiconductor structure of claim 1, wherein the pillar comprises conductively doped polysilicon.

6. The semiconductor structure of claim 1, wherein the charge block material comprises an oxide-nitride-oxide (ONO) material.

7. The semiconductor structure of claim 1, wherein at least some of the oxide materials of the at least two oxide portions comprise a top oxide portion, a middle oxide portion and a bottom oxide portion, and a density of the top oxide portion is different from a density of the bottom oxide portion and lower than a density of the middle oxide portion.

8. The semiconductor structure of claim 1, wherein at least some of the oxide materials of the at least two oxide portions comprise a top oxide portion, a middle oxide portion and a bottom oxide portion, and a density of the top oxide portion is different from a density of the bottom oxide portion and higher than a density of the middle oxide portion.

9. The semiconductor structure of claim 1, wherein at least some of the oxide materials of the at least two oxide portions comprise a top oxide portion, a middle oxide portion and a bottom oxide portion, and a density of the top oxide portion is substantially equal to a density of the bottom oxide portion and higher than a density of the middle oxide portion.

10. A semiconductor structure, comprising:
a stack of alternating dielectric materials and control gates, the dielectric materials of the stack comprising a top portion, a middle portion and a bottom portion, the top and bottom portions having lower densities than the middle portion;
a charge storage structure having the same height as the height of an adjacent control gate;
a charge block material between the charge storage structure and the adjacent control gate; and
a channel material extending through the stack of alternating dielectric materials and control gates.

11. The semiconductor structure of claim 10, wherein the dielectric material is selected from the group consisting of silicon oxide, silicon nitride, and silicon oxynitride.

12. The semiconductor structure of claim 10, further comprising a tunnel dielectric material between the channel material and the charge storage structure.

13. The semiconductor structure of claim 10, wherein the top and bottom portions of the dielectric material have substantially the same density.

14. The semiconductor structure of claim 10, wherein the structure comprises a three-dimensional NAND flash memory device.

15. A semiconductor structure, comprising:
a stack of alternating dielectric materials and control gates, each of the dielectric materials of the stack comprising at least two portions of materials formulated to have different rates of removal when exposed to the same etch chemistry and all horizontal surfaces of the control gates in direct contact with the dielectric materials;
charge storage structures laterally adjacent to the control gates, each of the charge storage structures having the same height as the height of a laterally adjacent control gate;
a charge block material between each of the charge storage structures and its laterally adjacent control gate; and
a pillar extending through the stack of alternating dielectric materials and control gates.

16. The semiconductor structure of claim 15, wherein each of the dielectric materials of the stack comprises at least a first material portion and a second material portion, the first material portion formulated to have an etch rate at least about two times greater than that of the second material portion when exposed to the same etch chemistry.

17. The semiconductor structure of claim 15, wherein the at least two portions of materials of the stack comprise a material selected from the group consisting of a silicon oxide ($SiO_x$) material, a silicon nitride ($SiN_y$) material, a silicon oxynitride ($SiO_xN_y$) material, and combinations thereof.

18. The semiconductor structure of claim 15, wherein at least some of the dielectric materials of the stack comprise a top material portion, a middle material portion and a bottom material portion, wherein the top material portion has substantially the same rate of removal as the bottom material portion and a higher rate of removal than that of the middle material portion when exposed to the same etch chemistry.

19. The semiconductor structure of claim 18, wherein the top material portion and bottom material portion comprise a silicon oxide ($SiO_x$) material, and the middle material portion comprises a silicon nitride ($SiN_y$) material.

20. The semiconductor structure of claim 18, wherein the top material portion and bottom material portion comprise a silicon oxide ($SiO_x$) material, and the middle material portion comprises a silicon oxynitride ($SiO_xN_y$) material.

* * * * *